(12) United States Patent
Kusko et al.

(10) Patent No.: US 6,836,865 B2
(45) Date of Patent: Dec. 28, 2004

(54) METHOD AND APPARATUS FOR FACILITATING RANDOM PATTERN TESTING OF LOGIC STRUCTURES

(75) Inventors: Mary P. Kusko, Hopewell Junction, NY (US); William V. Huott, Holmes, NY (US); Bryan J. Robbins, Poughkeepsie, NY (US); Timothy Charest, West Hurley, NY (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 09/973,398

(22) Filed: Oct. 9, 2001

(65) Prior Publication Data
US 2003/0070127 A1 Apr. 10, 2003

(51) Int. Cl.[7] .............................................. G01R 31/28
(52) U.S. Cl. ...................... 714/726; 714/729; 714/728; 714/727
(58) Field of Search ................................ 714/724, 726, 714/727, 728, 729, 731, 736, 30

(56) References Cited

U.S. PATENT DOCUMENTS

| | | | |
|---|---|---|---|
| 5,260,949 A | * | 11/1993 | Hashizume et al. ........ 714/731 |
| 5,323,400 A | * | 6/1994 | Agarwal et al. ............ 714/728 |
| 5,349,587 A | * | 9/1994 | Nadeau-Dostie et al. ... 714/729 |
| 5,983,380 A | * | 11/1999 | Motika et al. .............. 714/733 |
| 6,061,818 A | | 5/2000 | Touba et al. |
| 6,148,425 A | | 11/2000 | Bhawmik et al. |

* cited by examiner

*Primary Examiner*—Albert Decady
*Assistant Examiner*—John J. Tabone, Jr.
(74) *Attorney, Agent, or Firm*—Lynn Augspurger; Cantor Colburn LLP

(57) ABSTRACT

A method for preparing a logic structure for random pattern testing is disclosed. In an exemplary embodiment of the invention, the method includes configuring a select mechanism within a data scan chain, the select mechanism configured between a first register in the data scan chain and a second register. A parallel data path is routed within the scan chain, the parallel data path beginning from an input side of the first register, running through the select mechanism, and ending at an input side of the second register. Thus configured, the select mechanism is capable of switching a source path of input data to said second register from a normal data path to the parallel data path. When the parallel data path is selected as the source path of input data to the second register, data loaded into the second register matches data loaded into the first register.

19 Claims, 6 Drawing Sheets

METHOD AND APPARATUS FOR FACILITATING RANDOM PATTERN TESTING OF LOGIC STRUCTURES

BACKGROUND

The present invention relates generally to integrated circuit testing and, more particularly, to a method and apparatus for facilitating the random pattern testing of logic structures.

Integrated circuits (ICs) are tested to ensure that the component is defect-free after being manufactured and/or remains in proper working condition during use. The testing of the IC may be accomplished by applying a test pattern to stimulate the inputs of a circuit and monitoring the output response to detect the occurrence of faults. These test patterns may be applied to the circuit using an external testing device. Alternatively, given the practical reality of limited I/O pin availability and capability, as well as the tester memory needed to store the test patterns, the pattern generator may be a built-in, self test (BIST) structure comprising part of the internal circuitry in the IC which generates the test patterns.

Although it is desirable when testing the logic circuit to use deterministic testing by checking the circuit output response to all $2^n$ possible input permutations, this approach becomes impractical as the number of input variables n and the size of the pattern set increases. Thus, a related technique, referred to as pseudo-random testing, is employed when the number of input variables is so large that it becomes impractical to use an exhaustive testing approach. Pseudo-random testing is an alternative technique that generates test patterns in a random fashion from the $2^n$ possible patterns. In this approach, fewer than all of the $2^n$ patterns are tested. Because of the relatively low hardware overhead and the simplicity of test pattern generation, pseudo-random testing is a preferred technique for BIST. Practical circuits, however, often contain random pattern resistant faults which result in unacceptable low fault coverages and low circuit excitation for a reasonable test length.

Test patterns are typically graded against a fault model (e.g., the stuck-at-fault model). With pseudo-random data, certain random resistant structures are difficult to test. One example of such a "random pattern resistant" logic circuit is a compare circuit that compares the contents of a first register to the contents of a second register. Because the sizes of the registers to be compared can be several bits in length (e.g., 24 bits or even 80 bits or more), it is virtually assured from a statistical standpoint that the random bits generated and loaded into the first register will not exactly match the random bits generated and loaded into the second register. Thus, the compare circuit will almost always be tested in a mismatch condition with a conventional scan chain-based BIST design, even though a test of a match condition is equally (if not more) important. In addition, a "near match" condition (e.g., where only 1 of 24 bits is mismatched) is also desired test condition. Again, however, the statistical probabilities associated with achieving such a randomly generated data type make random pattern testing of this nature problematic at best. Because compare logic is often found in the most critical of timing paths in IC designs, the quality testing of such logic structures (so as to enable the detection of small delay defects) is a significant concern.

Since no single fault model represents all possible types of defects, a variety of testing techniques are typically employed to test a device. Such techniques may target specific fault models or may exercise the circuit in other ways to detect defects or faulty circuit behavior. Exercising the functional use of a chip is another method that may be used to test a device. However, this method can be very costly to implement, especially at lower packaging levels of a device. For example, during a wafer test, the functional exercising of logic can be either cost prohibitive or physically impossible altogether.

BRIEF SUMMARY

The foregoing discussed drawbacks and deficiencies of the prior art are overcome or alleviated by a method for preparing a logic structure for random pattern testing. In an exemplary embodiment of the invention, the method includes configuring a select mechanism within a data scan chain, the select mechanism configured between a first register in the data scan chain and a second register. A parallel data path is routed within the scan chain, the parallel data path beginning from an input side of the first register, running through the select mechanism, and ending at an input side of the second register. Thus configured, the select mechanism is capable of switching a source path of input data to the second register from a normal data path to the parallel data path. When the parallel data path is selected as the source path of input data to the second register, data loaded into the second register matches data loaded into the first register.

In a preferred embodiment, the first and second registers contain an equal number of data storage elements therein. In addition, a bitflip logic mechanism is configured within the parallel data path, the bitflip logic mechanism capable of inverting one or more data bits passing through the parallel data path. Thus, when the parallel data path is selected as the source path of input data to the second register and the bitflip logic mechanism is activated, the data loaded into the second register may be statistically mismatched from the data loaded into the first register by one bit or more.

Preferably, weight logic is used to control the frequency of occurrences in which the bitflip logic mechanism is caused to invert the data bits passing through the parallel data path. The weight logic further includes a multiple-input AND gate, with each of the multiple inputs being coupled to independent, random bit generating devices. Finally, the bitflip logic mechanism further comprises an exclusive OR (XOR) gate, the XOR gate having the output of the multiple-input AND gate as a first input thereto, and a corresponding data bit in the parallel data path as a second input thereto.

BRIEF DESCRIPTION OF THE DRAWINGS

Referring to the exemplary drawings wherein like elements are numbered alike in the several Figures.

DETAILED DESCRIPTION

Figure 1:
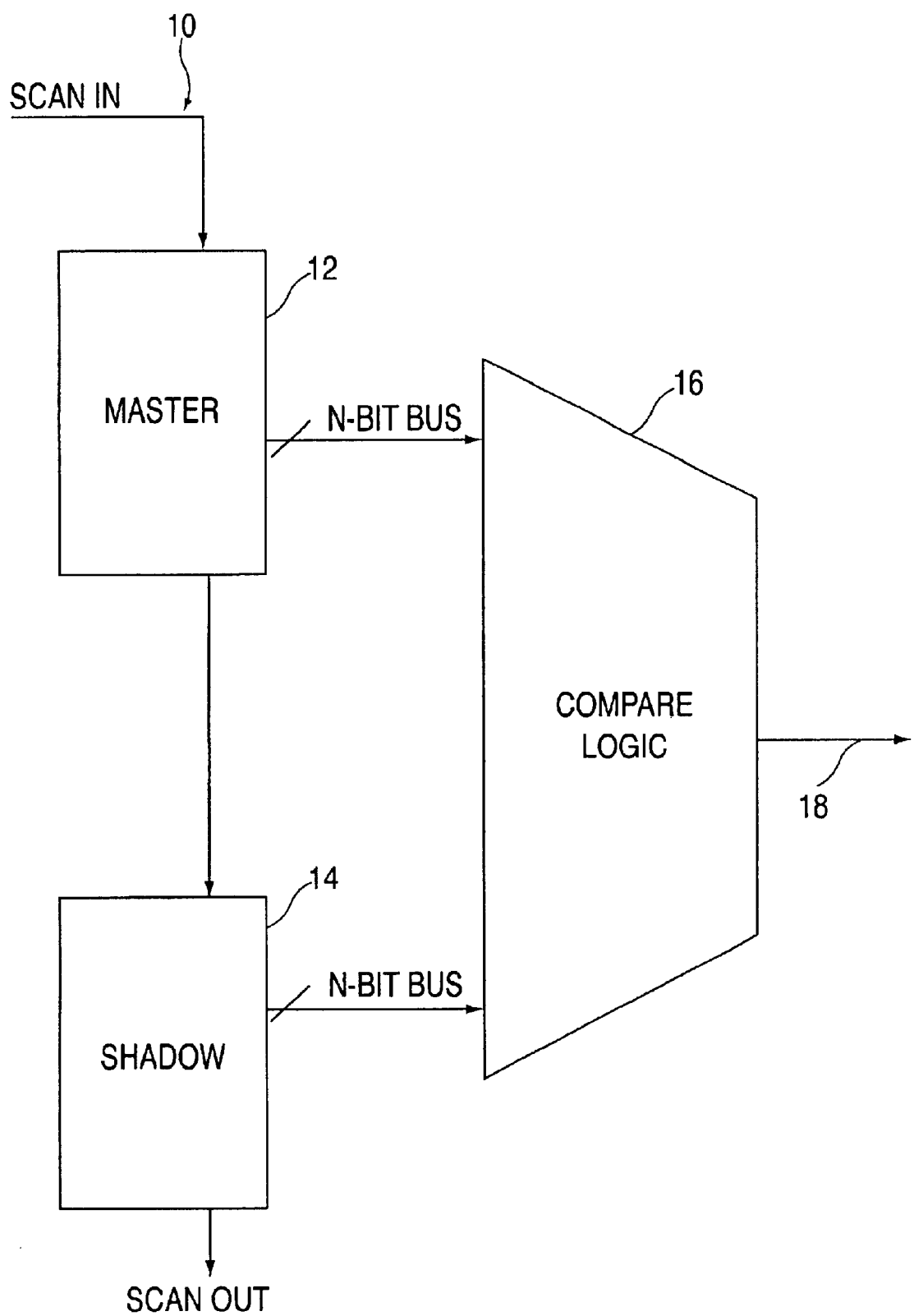
FIG. 1 is a block diagram illustrating a section of an existing scan chain having a pair of registers therein for storing test data to be utilized by a circuit under test.

Referring initially to FIG. 1, there is shown a conventional scan chain 10 which includes a first n-bit register 12 (hereinafter referred to as master register) and a second n-bit register 14 (hereinafter referred to as shadow register) therein. In random pattern testing used, for example, in LBIST systems, randomly generated data bits from a data generating source such as a linear feedback shift register (LFSR) (not shown) are serially loaded into individual latches within devices such as registers 12 and 14.

In the embodiment depicted, the shadow register 14 is shown located downstream from the master register 12, and thus the data bits for a given test intended to be stored in shadow register 14 are first passed through master register 12 during the serial loading process. However, shadow register 14 could alternatively be included within a different scan chain (not shown) altogether. Regardless of the location of registers 12 and 14, it should be noted that the order of storage elements contained within registers 12 and 14 are to be consistent with one another. This could include a configuration wherein registers 12 and 14 each contain latches therein not specifically used, but which are bits within the registers being compared. For example, both master register 12 and shadow register may each have a number of data latches not being compared among the latches that make up the registers, so long as the locations of the "compare" latches within the registers are consistent with one another.

Once the test data is generated and scanned into registers 12 and 14, it may be used to test a logic circuit such as a comparator 16. The comparator 16 compares each data bit in the master register 12 with a corresponding data bit in the shadow register 14. If each bit in the master register 12 matches the corresponding bit in the shadow register 14, then the output 18 of comparator 16 will reflect this condition (e.g., output=1). However, if one or more of the data bits are mismatched, then the output of comparator 16 will be 0.

As stated previously, a mismatch condition is readily testable with randomly generated data, but a match condition is not. Although weighted random patterns (WRP) have been used to increase the likelihood of generating certain patterns (such as all 1's, for example), this use of technique is limited in that the test data itself is weighted toward one logical value or the other. A need, therefore, exists for more easily rendering random pattern resistant logic amenable to random pattern testing.

Figure 2:
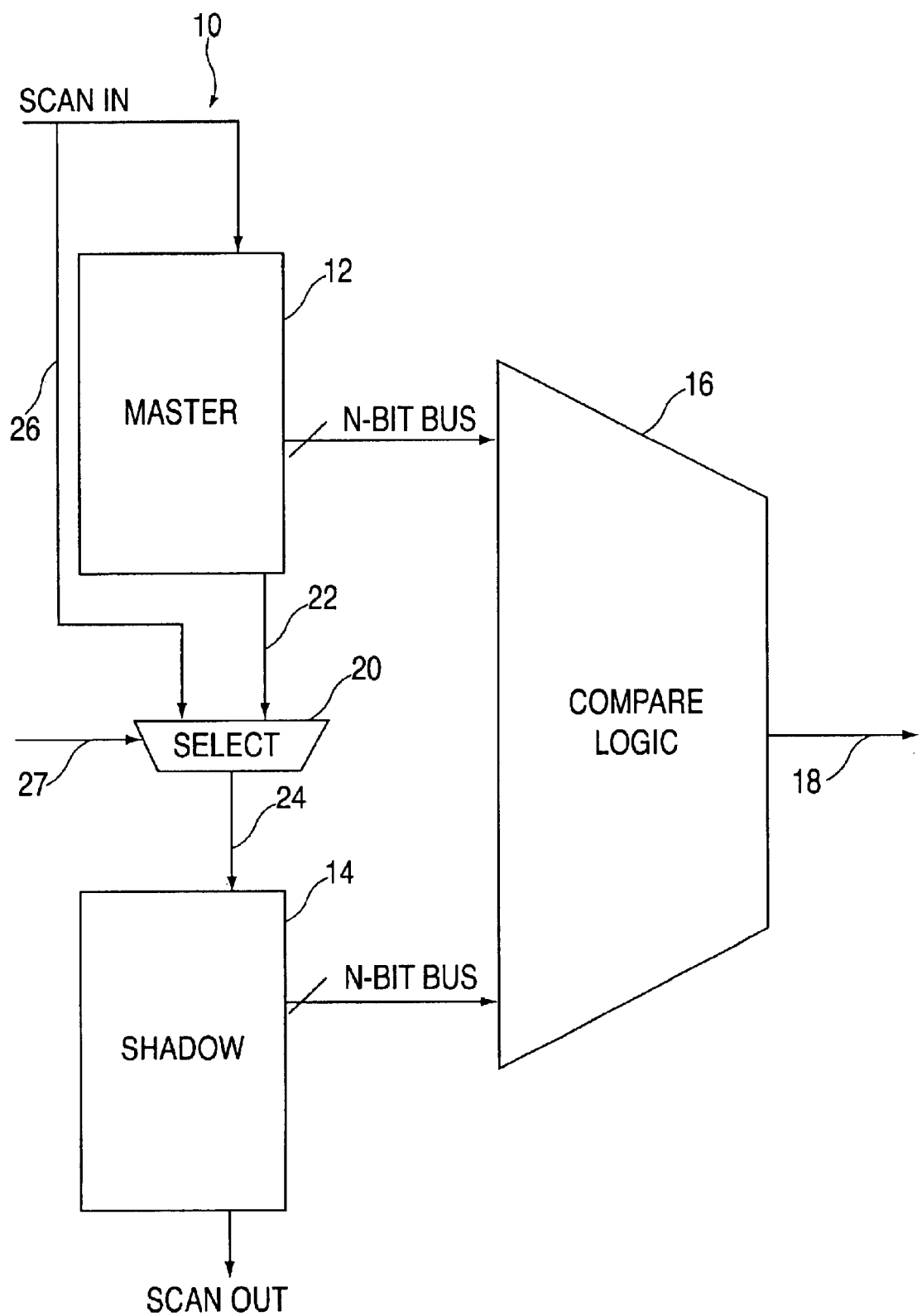
FIG. 2 is a block diagram illustrating a section of a scan chain and registers having a select mechanism therein, in accordance with an embodiment of the invention.

Therefore, in accordance with an embodiment of the invention, a method and apparatus is disclosed which facilitates the random pattern testing of logic structures. Referring specifically now to FIG. 2, there is shown a scan chain 10 and registers 12, 14, further featuring a novel select mechanism 20 therein. For ease of description, like components appearing in the various Figures are labeled with the same reference numerals.

In the embodiment shown, select mechanism 20 is configured within scan chain 10 and is positioned between the output data path 22 of master register 12 and the input data path 24 of shadow register 14. A parallel data path 26 is further defined from the input side of master register 12 directly to the select mechanism 20. Thereby, depending upon the value of an input control signal 27, the select mechanism 20 selectively determines the source of the input data to shadow register 14. In other words, select mechanism 20 is used to switch the source of input data to the shadow register 14 from the normal output data path 22 of master register 12 to the parallel data path 26.

It is again noted at this point that FIGS. 1 and 2 depict the shadow register 14 contiguously located with respect to master register 12 (with data also passing through select mechanism 20 in FIG. 2). However, this need not be the case. In other words, any number of other storage registers or individual storage latches may be disposed between master register 12 and shadow register 14, so long as the parallel data path 26 from the input side of master register 12 circumvents any such storage devices located therebetween. In the case where shadow register 14 resides in a different scan chain (not shown), the parallel data path would circumvent any storage devices in the different scan chain.

It will be seen that whenever the input data path 24 to shadow register 14 is disconnected from output data path 22 and coupled to parallel data path 26, the data loaded into shadow register 14 will be identical to the data loaded into master register 12, regardless of the values of the randomly generated bits inputted into scan chain 10. As a result, the comparator 16 may be tested in a match mode, since the n-bit data bus of master register 12 matches the n-bit data bus of shadow register 14. Moreover, this test condition has been achieved without the use of weighted random data, deterministic patterns or other complicated circuitry. Once it is no longer desired to have the data in registers 12, 14 automatically match, then select mechanism 20 may reconnect input data path 24 to output data path 22.

Figure 3:
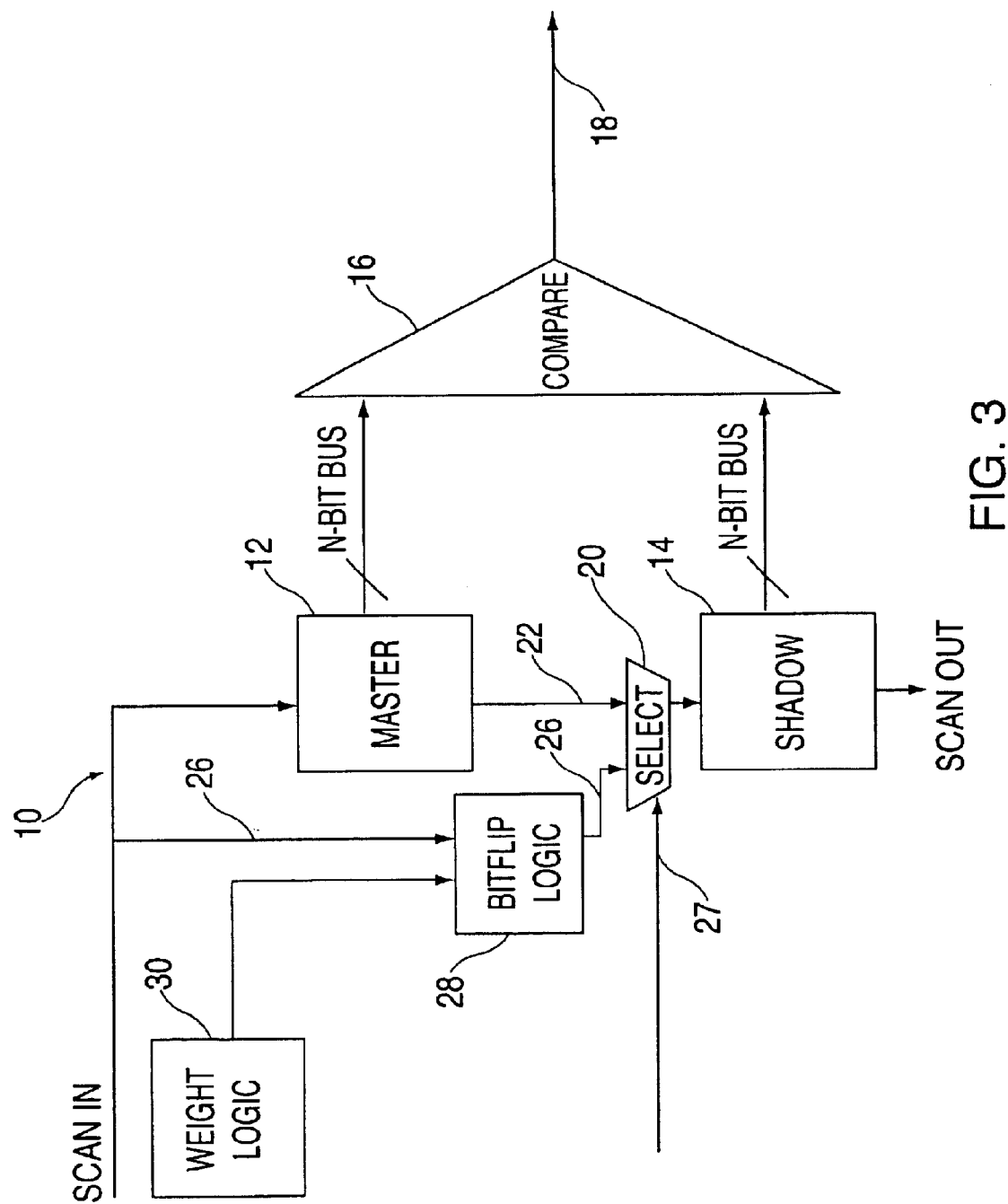
FIG. 3 is a block diagram illustrating a section of a scan chain having a select mechanism therein and a randomly weighted bit flipping mechanism, in accordance with an alternative embodiment of the invention.

As also stated earlier, another desired test condition for a compare circuit is the instance of a "near match" condition, wherein only a single bit (or perhaps two bits) in the compared registers is mismatched. Such a test condition may readily be generated in accordance with an alternative embodiment of the invention, as shown in FIG. 3.

A bitflip logic mechanism 28 and associated weight logic 30 are configured for randomly inverting a bit sent through parallel data path 26. The particular weight programmed into weight logic 30 will determine the statistical likelihood of a given bit being flipped by bitflip logic mechanism 28. Thus, if it is desired to test comparator 16 with a near match condition, such as by having a single mismatched bit between master register 12 and shadow register 14, then select mechanism 20 is activated to switch the source of input data to the shadow register 14 from the output data path 22 of master register 12 to the parallel data path 26. As the parallel data path 26 is routed through bitflip logic mechanism 28, the weight logic 30 is enabled, thereby establishing a probabilistic frequency for the inversion of a given bit through parallel data path 26. For example, the probabilistic frequency may be set at about 50%, wherein there is approximately a 1 in 2 chance that one of the bits sent through parallel data path 26 will be inverted. Obviously, the weight logic 30 may be configured to increase or decrease the desired frequency.

If no bit flipping is desired, the bitflip logic mechanism 28 and weight logic 30 may be disabled, and the data will pass undisturbed through parallel data path 26 and into shadow register 14. Alternatively, if it is not desired to match the contents of master register 12 and shadow register 14, the select mechanism 20 may reconnect input data path 24 to output data path 22.

Figure 4:
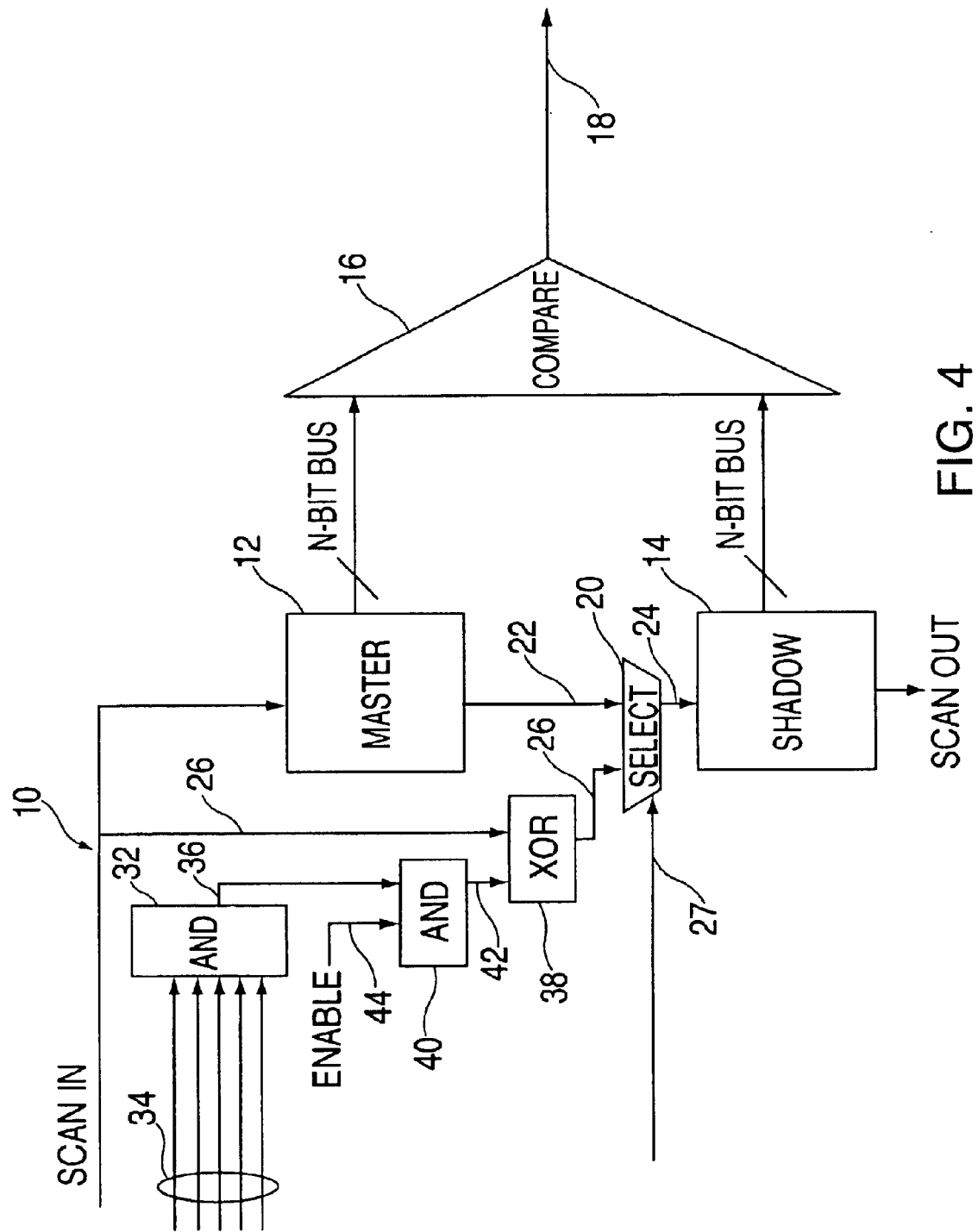
FIG. 4 is a block diagram which particularly illustrates one possible logic embodiment of the randomly weighted bit flipping mechanism shown in FIG. 3.

Referring now to FIG. 4, an exemplary implementation for bitflip logic mechanism 28 and weight logic 30 is illustrated. A first AND gate 32 has a series of inputs 34 thereto, which inputs 34 are randomly generated binary signals, such as from an LFSR (not shown). Each random input 34 to first AND gate 32 is independent with respect to the other random inputs thereto. In the embodiment depicted, there are five randomly generated inputs. Thus, the output 36 of AND gate 32 has a 1/32 probability of being a "1", since all five inputs 34 must also be "1" for that condition to occur. An exclusive OR (XOR) gate 38 is used to invert a data bit from parallel data path 26 whenever the output 36 of first AND gate 32 is "1".

In order to selectively enable and disable this bit inversion function, however, a second AND gate 40 is coupled between the output 36 of first AND gate 32 and XOR gate 38. Because the control input 42 of XOR gate 38 must be "1" in order for the data bit input thereto (parallel data path 26) to be inverted, the enabling signal 44 to second AND gate 40 must be "1" as well. If the enabling signal 44 is not activated, then no inversion will occur even if output 36 is "1", since the control input 42 of XOR gate 38 would be "0".

Figure 5:
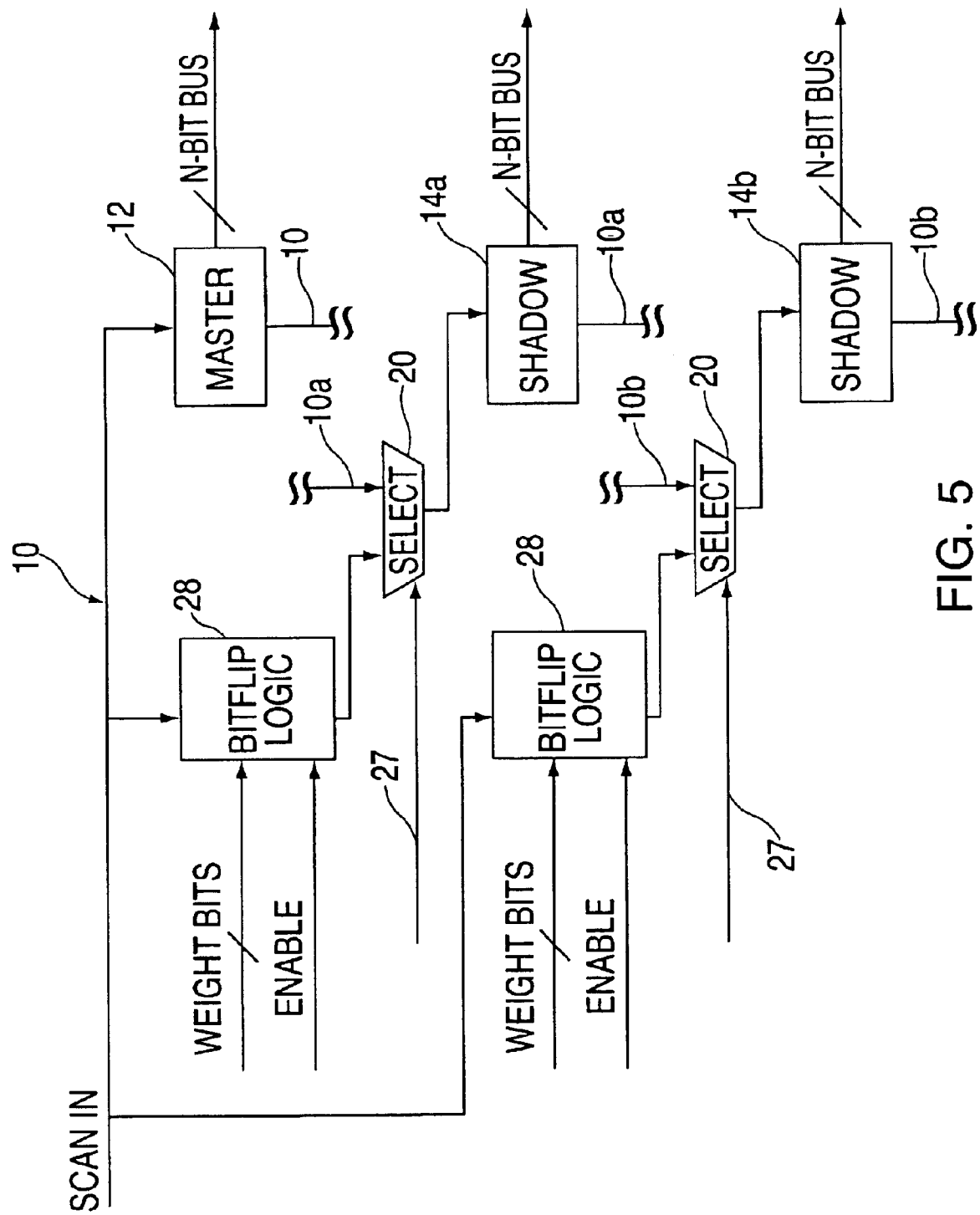
FIG. 5 is a block diagram illustrating a section of a scan chain and multiple registers having multiple select mechanisms associated therewith, in accordance with still another embodiment of the invention.

FIG. 5 illustrates a section of a scan chain 10a with a master register 12 and a plurality of shadow registers 14a and 14b, in accordance with still another embodiment of the invention. The shadow registers 14a, 14b have normal data paths 10a and 10b, respectively. Data paths 10a and 10b may be included within scan chain 10 or, alternatively, they may be part of separate scan chains. Each shadow register 14a, 14b has both a select mechanism 20 and bitflip logic mechanism 28 associated therewith. (For simplification purposes, the weight logic is shown included within bitflip logic mechanism 28.) In such a configuration, it will be appreciated that many registers within a scan chain or scan chains may be used for comparison with one another during random pattern testing. So long as a parallel data path is routed from a common reference point to a switching mechanism 20 coupled to an input side of a given register, the identical loading of randomly generated data inputted into the scan chain 10 may be accomplished from register to register. Furthermore, each individual select mechanism 20 may be controlled independently, as is the case with the associated bitflip logic mechanisms 28. Each group of weight logic within bitflip logic mechanisms 28 may be programmed the same or differently from register to register. In the case where the weighting is the same for each mechanism 28, the individual random inputs that determine the weight may be the same or they may be different.

Figure 6:
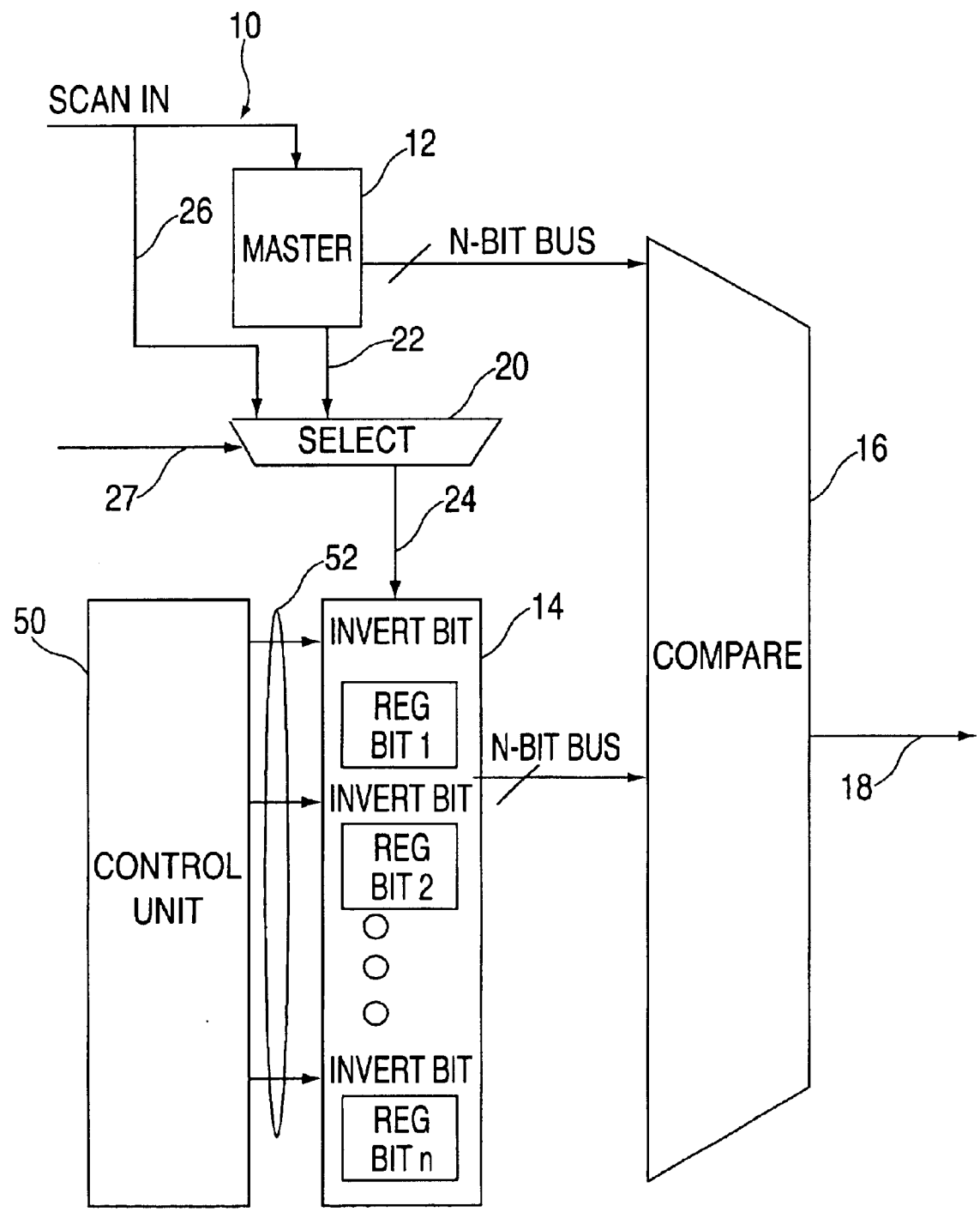
FIG. 6 is a block diagram which illustrates an alternative embodiment of the randomly weighted bit flipping mechanism depicted in FIGS. 3–5.

Finally, FIG. 6 illustrates an alternative embodiment for the bitflip logic mechanisms 28 depicted in FIGS. 3–5. Instead of randomly inverting a bit passing through parallel data path 26 (and before being loaded into the first latch of shadow register 14), one or more bits may be inverted as they pass through the individual latches within shadow register 14. As shown in FIG. 6, a control unit 50 is configured so as to provide control signals 52 to inverting devices located in front of each storage latch in shadow register 14. In one aspect, control unit 50 may be configured to invert a test bit at a randomly selected location within shadow register 14. In another possible aspect, control unit 50 may be programmed as a decoder or counter such that only one bit at a time is inverted, but all bits eventually get inverted.

As seen from the above described invention embodiments, certain logic that has been previously resistant to random pattern testing, such as compare circuits, may now be tested with desired test conditions. Rather than implementing a weighted random data generation scheme, which affects the value of the test data itself, the disclosed select mechanisms may be implemented so as to load identical, randomly generated data into any number of selected registers. On the other hand, this approach may also be used in conjunction with weighted random data to increase the frequency of comparing test data comprising mostly 1's or mostly 0's. It will be appreciated, from the above described embodiments, that logic which had only previously been "tested" with existing approaches, may also be exercised from a functional perspective. Not only is logic tested based upon modeled faults, but it is also tested on the functional operation of such (e.g., a compare function).

Moreover, the bitflip logic also provides the capability of inverting one (or more) of the bits loaded into a compare register to create a near match condition for testing. Although the disclosed invention embodiments have been described in the context of a compare circuit, it will be understood that these principles are applicable to any other logic elements which may use duplicated, near matched or weighted random scan chain data as test inputs.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for preparing a logic structure for random pattern testing, the method comprising;
   configuring a select mechanism;
   routing a parallel data path with respect to first scan chain, said parallel data path beginning from an input side of a first register included in said first scan chain, said parallel data path running through said select mechanism, and ending at an input aide of a second register included in a second scan chain;
   said select mechanism being capable of switching a source path of input data to said second register between a normal data path comprising said second scan chain and said parallel data path;
   wherein, when said parallel data path is selected as said source path of input data to said second register, data loaded from said parallel data path into said second register is selectively identical to data loaded into said first register from said input side of said first register.

2. The method of claim 1, wherein said first and second registers contain an equal number of data storage elements therein.

3. The method of claim 1, further comprising:
   selecting said parallel data path as said source path of input data to said second register; and
   inputting the contents of said first and second registers into a logic structure for testing.

4. The method of claim 1, further comprising:
   configuring a bitflip logic mechanism within said parallel data path, said bitflip logic mechanism capable of inverting one or more data bits passing through said parallel data path;
   wherein, when said parallel data path is selected as said source path of input data to said second register and said bitflip logic mechanism is activated, said data loaded into said second register is statistically biased to be mismatched from said data loaded into said first register by one bit or more.

5. The method of claim 4, further comprising:

configuring weight logic to control a frequency of occurrences in which said bitflip logic mechanism is caused to invert said one or more data bits passing through said parallel data path.

6. The method of claim 5, wherein:

said weight logic further comprises a multiple-input AND gate, each of said multiple inputs being coupled to independent, random bit generating devices.

7. The method of claim 6, wherein:

said bitflip logic mechanism further comprises an exclusive OR (XOR) gate, said XOR gate having an output of said multiple-input AND gate as a first input thereto, and a corresponding data bit in said parallel data path as a second input thereto.

8. A method for configuring a built in, self-test (BIST) circuit used in random pattern testing of integrated circuits, the BIST circuit including a first register therein, and plurality of subsequent registers for storing data to be tested with data contained in the first register, the method comprising:

configuring a plurality of select mechanisms, each of said plurality of select mechanisms corresponding to one of the subsequent registers;

routing a plurality of parallel data paths from a first scan chain containing the first register therein, said plurality of parallel data paths each beginning from an input side of said first register, running through a corresponding one of said plurality of select mechanisms, and ending at an input side of a corresponding one of the subsequent registers;

said plurality of select mechanisms each being capable at switching a source path of input data to each of the subsequent register between a normal data path, said normal data path comprising a separate scan chain, and a corresponding one of said parallel data paths;

wherein, for each of the subsequent registers having one of said parallel data paths selected as said source path of input data thereto, the data loaded therein from said corresponding one of said parallel data paths is selectively identical to data loaded into the first register from said input side of said first register.

9. The method of claim 8, wherein the first register and the subsequent registers contain an equal number of data storage elements therein.

10. The method of claim 8, further comprising:

configuring a bitflip logic mechanism within each of said plurality of parallel data paths, said bitflip logic mechanisms capable of inverting one or more data bits pausing through said plurality of parallel data paths;

wherein, whenever one of said plurality of parallel data paths is selected as said source path of input data to a corresponding one of the subsequent registers, and a corresponding bitflip logic mechanism thereto is activated, said data loaded into said corresponding one of the subsequent registers is statistically biased to be mismatched from said data loaded into the first register by one bit or more.

11. The method of claim 10, further comprising:

configuring weight logic to control a frequency of occurrences in which each of said bitflip logic mechanisms is caused to invert said one or more data bits passing through said plurality of parallel data paths.

12. The method of claim 11, wherein:

said weight logic further comprises a multiple-input AND gate, each of said multiple inputs being coupled to independent, random bit generating devices.

13. The method of claim 12, wherein:

said bitflip logic mechanism further comprises an exclusive OR (XOR) gate, said XOR gate having an output of said multiple-input AND gate as a first input thereto, and a corresponding data bit in said plurality of parallel data paths as a second input thereto.

14. An apparatus for preparing a logic structure for random pattern testing, comprising:

a select mechanism;

a parallel data path routed with respect to a first scan chain, said parallel data path beginning from an input side of a first register included said first scan chain, said parallel data path running through said select mechanism, and ending at an input side of a second register included in a second scan chain;

said select mechanism being capable of switching a source path of input data to said second register between a normal data path comprising said second scan chain and said parallel data path;

wherein, when said parallel data path is selected by said select mechanism as said source path of input data to said second register, data loaded into said second register from said parallel data path is selectively identical to data loaded into said first register from maid input side of said first register.

15. The apparatus of claim 14, wherein said first and second registers contain an equal number of data storage elements therein.

16. The apparatus of claim 14, further comprising:

a bitflip logic mechanism configured within said parallel data path, said bitflip logic mechanism capable of inverting one or more data bits passing through said parallel data path;

wherein, when said parallel data path is selected as said source path of input data to said second register and said bitflip logic mechanism is activated, said data loaded into said second register is statistically biased to be mismatched from said data loaded into said first register by one bit or more.

17. The apparatus of claim 16, further comprising:

Weight logic coupled to said bitflip mechanism, said weight logic used to control a frequency of occurrences in which said bitflip logic mechanism is caused to invert said one or more data bits passing through said parallel data path.

18. The apparatus of claim 17, wherein:

said weight logic farther comprises a multiple-input AND gate, each of said multiple inputs being coupled to independent, random bit generating devices.

19. The apparatus of claim 18, wherein:

said bitflip logic mechanism further comprises an exclusive OR (XOR) gate, said XOR gate having an output of said multiple-input AND gate as a first input thereto, and a corresponding data bit in said parallel data path as a second input thereto.

* * * * *